(12) United States Patent
Kim

(10) Patent No.: US 7,030,004 B2
(45) Date of Patent: Apr. 18, 2006

(54) METHOD FOR FORMING BOND PAD OPENINGS

(75) Inventor: Su Hyun Kim, Kuching (MY)

(73) Assignee: 1st Silicon (Malaysia) Sdn Bhd, Sarawak (MY)

( * ) Notice: Subject to any disclaimer, the term of this patent is extended or adjusted under 35 U.S.C. 154(b) by 319 days.

(21) Appl. No.: 10/703,482

(22) Filed: Nov. 10, 2003

(65) Prior Publication Data

US 2005/0101146 A1    May 12, 2005

(51) Int. Cl.
*H01L 21/44*    (2006.01)

(52) U.S. Cl. ............... 438/612; 438/613; 438/614; 438/617; 438/627; 257/748; 257/749; 257/750; 257/751

(58) Field of Classification Search ........ 438/612–617, 438/627, 643; 257/748–751, 774
See application file for complete search history.

(56) References Cited

U.S. PATENT DOCUMENTS

| | | | | |
|---|---|---|---|---|
| 5,242,864 A | * | 9/1993 | Fassberg et al. | 438/701 |
| 5,960,306 A | * | 9/1999 | Hall et al. | 438/612 |
| 6,451,681 B1 | * | 9/2002 | Greer | 438/601 |
| 6,660,624 B1 | * | 12/2003 | Tzeng et al. | 438/612 |
| 6,677,226 B1 | * | 1/2004 | Bowen et al. | 438/601 |
| 6,873,047 B1 | * | 3/2005 | Wada et al. | 257/748 |

* cited by examiner

*Primary Examiner*—Duy-Vu N. Deo
(74) *Attorney, Agent, or Firm*—Lawrence Y.D. Ho & Associates

(57) ABSTRACT

The invention provides a method for forming bond pad openings through a three-layer passivation structure, which protects the semiconductor device prior to bonding and packaging. Two passivation layers are formed over a semiconductor device with bond pads formed thereon. Openings are formed through the passivation layers to expose the bond pads. The openings are then filled with a photoresist material before depositing a polyimide layer over the passivation layers. Openings are formed in the polyimide layer so as to expose the filled openings. The photoresist material in the filled openings is subsequently removed to expose the bond pads.

6 Claims, 2 Drawing Sheets

METHOD FOR FORMING BOND PAD OPENINGS

FIELD OF THE INVENTION

The present invention relates generally to techniques for forming bond pad openings.

BACKGROUND OF THE INVENTION

As part of the final steps in the fabrication of a semiconductor device, passivation layers are formed over the device having bond pads formed thereon. The passivation layers serve to protect the device from moisture and scratching during testing and packaging processes. The passivation layers typically include a silicon oxide layer and a silicon nitride. In order to provide a complete hermetic sealing of the device during testing, some manufacturers use a three-layer structure in which a third layer of polyimide is formed over the silicon oxide and silicon nitride layers. The polyimide layer functions as a protective overcoat. Bond pad openings are etched through the passivation layers and the polyimide protective overcoat to expose the underlying bond pads. After the bond pad openings are formed, the quality of the device is electrically tested. There are various methods for forming the bond pad openings through the three-layer structure. However, there remains a need for an improved method of forming bond pad openings that minimizes the contact between the polyimide and the bond pad. If residual polyimide remains in the bond pad openings, the testing process is greatly hindered.

SUMMARY OF THE INVENTION

The present invention provides a method for forming bond pad openings through a three-layer passivation structure, which protects the semiconductor device prior to bonding and packaging. A lower passivation layer and an upper passivation layer are formed over a semiconductor device with bond pads formed thereon. Openings are formed through the upper and lower passivation layers to expose the bond pads. The openings are then filled with a photoresist material before depositing a polyimide layer over the upper passivation layer. Next, openings are formed in the polyimide layer so as to expose the filled openings. The photoresist material in the filled openings is removed to expose the bond pads.

The advantages and novel features of the present invention will become apparent from the following detailed description of the preferred embodiment of the invention when considered in conjunction with the accompanying drawings.

DETAILED DESCRIPTION OF THE INVENTION

Figure 1:
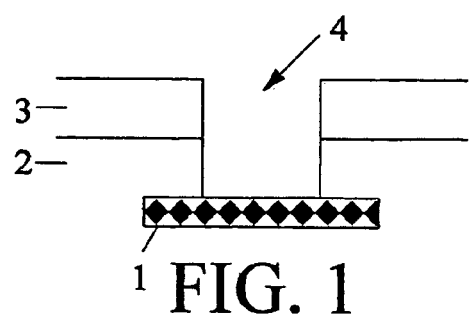
FIGS. 1–7 illustrate the sequence of the process steps in accordance with the preferred embodiment of the present invention.
Figure 2:
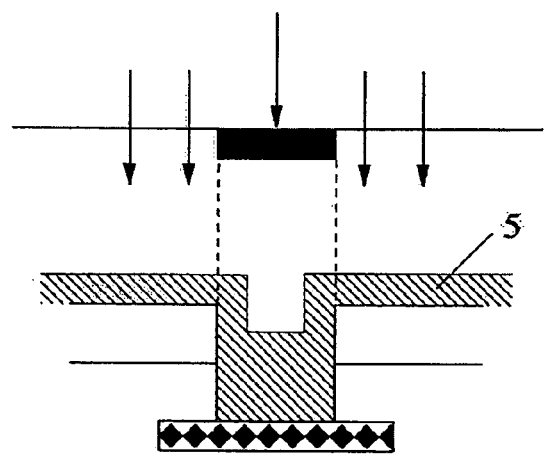
Figure 3:
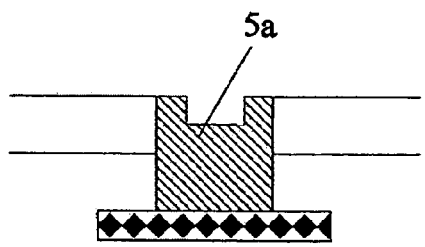
Figure 4:
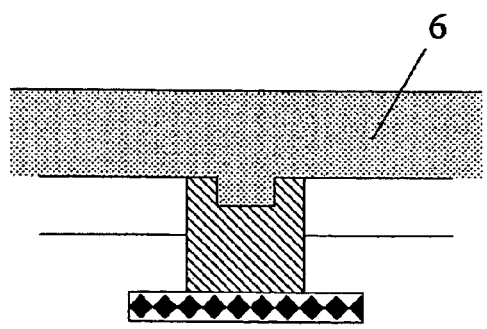
Figure 5:
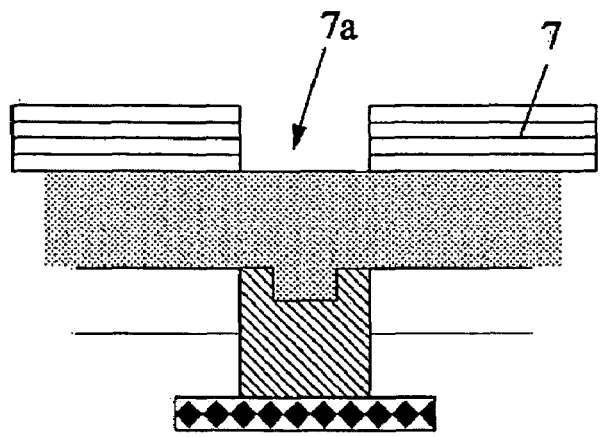
Figure 6:
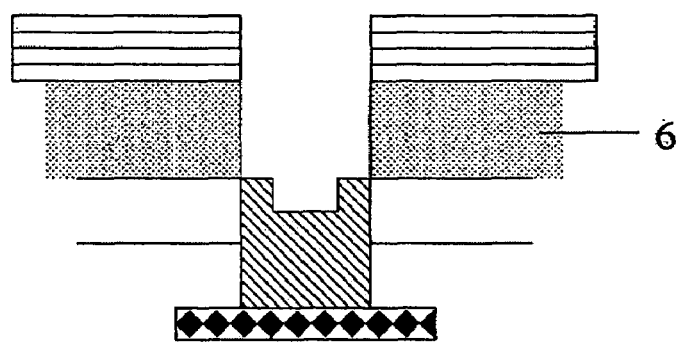
Figure 7:
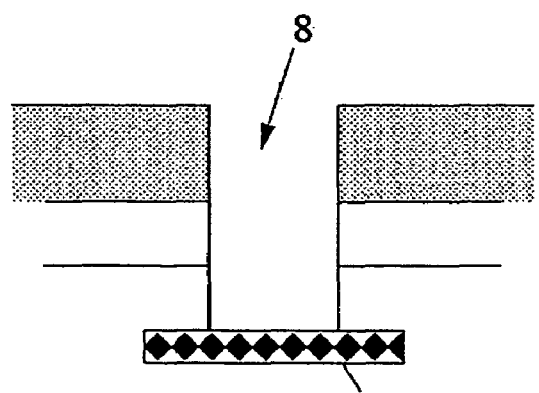

Referring to FIG. 1, a lower passivation layer 2 and an upper passivation layer 3 are successively formed on a semiconductor device having a bond pad pattern 1. The lower passivation layer 2 may include, for example, silicon oxide or PSG. The upper passivation layer 3 may include doped silicon nitride. The upper and lower passivation layers may be deposited by plasma-enhanced chemical vapor deposition (PECVD). The lower metal pattern 1 may include aluminum or an alloy thereof. An opening 4 is formed in the lower passivation layer 2 and upper passivation layer 3 by a conventional etching technique to expose the bond pad pattern 1 as shown in FIG. 1. Referring to FIG. 2, a relatively thin, sacrificial photoresist coating 5 is formed over the upper passivation layer 3 in such a manner that the opening 4 is substantially filled as shown. The photoresist coating 5 has a thickness of less than about 1000 Angstroms. Next, the photoresist coating 5 is exposed using a conventional photolithographic technique as shown in FIG. 2 so as to change the solubility of the photoresist material outside of the opening 4. Referring to FIG. 3, the exposed photoresist coating is developed in a conventional developing solvent so that the photoresist material outside the opening 4 is removed leaving only the remaining photoresist material 5a in the opening 4. Then, as shown in FIG. 4, a polyimide layer 6 is deposited over the device in such a manner that a substantially planar upper surface is achieved. The thickness of the polyimide layer is preferably 4 µm. An example of a suitable polyimide is that sold under the trade name "PIQ" by Hitachi Chemical Co., Ltd of Japan. Referring to FIG. 5, a photoresist pattern 7 is formed on the polyimide layer 6 using a conventional photolithographic technique. The photoresist pattern 7 provides a pattern opening 7a that aligns with the filled opening 4. Subsequently, the polymide layer 6 is etched by wet etching using a conventional organic etchant, for example, an aqueous solution containing tetra methyl ammonium hydroxide, until the remaining photoresist material 5a in the opening 4 is exposed as shown in FIG. 6. The photoresist pattern 7 and the remaining photoresist material 5a are then stripped so that a contact via 8 is formed over the lower metal pattern 1 as shown in FIG. 7. The photoresists 7 and 5a may be stripped simultaneously or in separate steps using a conventional photoresist stripper.

The present invention has been described with reference to a specific embodiment, it should be understood to those skilled in the art that many changes and modifications may be made therein without departing from the spirit and cope of the appended claims.

What is claimed is:

1. A method for forming bond pad openings on a semiconductor device, said method comprising the steps of:

forming a lower passivation layer over a semiconductor device having at least one bond pad thereon;

forming an upper passivation layer over the lower passivation layer;

forming an opening through the upper and lower passivation layers to expose said at least one bond pad;

forming a coating of photoresist material over the upper passivation layer and substantially filling the opening with the photoresist material;

stripping the photoresist material outside of the opening leaving only the photoresist material in the opening;

depositing a polyimide layer over the upper passivation layer while covering the filled opening until the top surface of the polyimide layer is substantially planar;

forming a photoresist mask over the polyimide layer, wherein the photoresist mask has an opening that aligns with the filled opening;

etching the polyimide through the opening in the photoresist mask so as to expose the filled opening;

stripping the photoresist mask; and removing the photoresist material in the filled opening so as to expose said at least one bond pad.

2. The method of claim 1 wherein the upper passivation layer comprises doped silicon nitride.

3. The method of claim 1 wherein the lower passivation layer comprises silicon oxide or PSG.

4. The method of claim 1 wherein the steps of stripping the photoresist mask and removing the photoresist material in the opening are performed simultaneously.

5. The method of claim 1 wherein the steps of stripping the photoresist mask and removing the photoresist material in the opening are performed in separately.

6. A method for forming bond pad openings on a semiconductor device, said method comprising the steps of:

forming a passivation layer over a semiconductor device having at least one bond pad thereon;

forming an opening through the passivation layer to expose said at least one bond pad;

forming a coating of photoresist material over the passivation layer and substantially filling the opening with the photoresist material;

stripping the photoresist material outside of the opening leaving only the photoresist material in the opening;

depositing a polyimide layer over the passivation layer while covering the filled opening until the top surface of the polyimide layer is substantially planar;

forming a photoresist mask over the polyimide layer, wherein the photoresist mask has an opening that aligns with the filled opening;

etching the polyimide through the opening in the photoresist mask so as to expose the filled opening;

stripping the photoresist mask; and removing the photoresist material in the filled opening so as to expose said at least one bond pad.

* * * * *